March 31, 1970 SATOSHI YOSHIOKA ET AL 3,503,798
SILICON NITRIDE FILM DEPOSITION METHOD
Filed Oct. 23, 1967
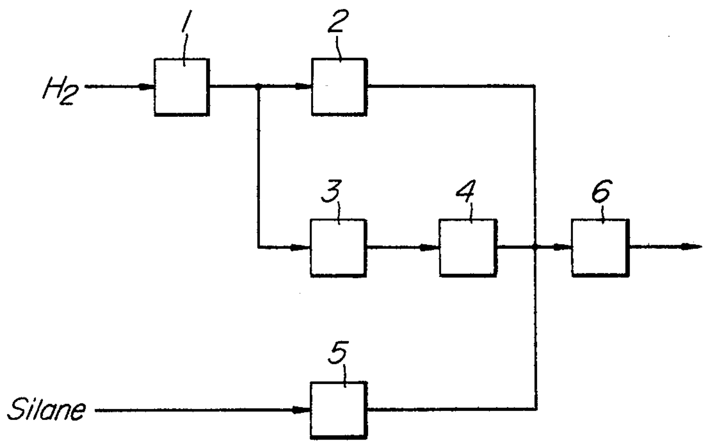
INVENTORS
SATOSHI YOSHIOKA,
SHIGETOSHI TAKAYANAGI,
BY Stevens, Davis, Miller & Mosher
ATTORNEYS 3,503,798

SILICON NITRIDE FILM DEPOSITION METHOD

Satoshi Yoshioka, Nishinomiya-shi, and Shigetoshi Takayanagi, Kyoto, Japan, assignors to Matsushita Electronics Corporation, Osaka, Japan, a corporation of Japan Filed Oct. 23, 1967, Ser. No. 677,147
Claims priority, application Japan, Oct. 28, 1966, 41/71,595
Int. Cl. B44d *1/18*
U.S. Cl. 117—215 6 Claims

ABSTRACT OF THE DISCLOSURE

A method of depositing a silicon nitride film on the surface of a semiconductor substrate by maintaining the surface of the semiconductor substrate at a temperature of 550° to 850° C. and acting on said heated surface a reactant gas consisting of a mixture of silane ($SiH_4$), hydrazine ($N_2H_4$) and a carrier gas. The present invention establishes the conditions such as the temperature of the semiconductor substrate in a reaction tube, and the concentrations each of and the concentration ratio between silane and hydrazine in the reaction tube, and thereby enables a silicon nitride film to be deposited on said substrate industrially.

BACKGROUND OF THE INVENTION

Field of the invention

The present invention relates to a silicon nitride film deposition method and more particularly to a method of depositing a silicon nitride film on the surfaces of semiconductor substrates to produce semiconductor devices.

Description of the prior art

In the production of semiconductor devices, it is essential to deposit on the surface of a semiconductor substrate a physically and chemically stable insulating film which will serve as a mask for the selective diffusion of impurities during the production process or as a protecting and insulating film for the semiconductor device proper, and amorphous silicon dioxide has heretofore been used for the formation of such insulating film.

Recently, however, it was discovered that amorphous silicon nitride has better properties than silicon dioxide as being the afore-mentioned impurity diffuson mask or protecting and insulating film of semiconductor devices, and the amorphous silicon nitride is now being used in the production of semiconductor devices.

Generally, deposition of a silicon nitride film has been effected by acting a mixed gas, composed of silane, ammonia and hydrogen, on the surface of a semiconductor substrate which is heated at a temperature of 750° C. or higher. However, according to such conventional method, the deposition rate of the silicon nitride film is determined by the decomposition velocity of ammonia and, in order to achieve the deposition of a silicon nitride film of desired quality at an industrially acceptable rate, the surface of the semiconductor substrate used must be heated to a temperature as high as about 750° C. or even higher. Because, at a temperature below 750° C., the decomposition reaction of ammonia does not proceed sufficiently and it is, therefore, impossible to obtain a silicon nitride film of high purity.

With the progress in the semiconductor technology in recent years, semiconductor devices of higher quality have been called for and, in order to provide such semiconductor devices, there has been a demand for a method by which the deposition of silicon nitride film can be carried out at relatively low temperatures so as not to substantially deteriorate the chemical composition, purity, structure and density of said film and yet not to change the impurity distribution profile on the surface thereof which has already been subjected to a diffusion process.

SUMMARY OF THE INVENTION

The present invention contemplates the provision of a silicon nitride film deposition method which will well fulfill the requirements set forth above.

Namely, an object of the present invention is to provide a silicon nitride film deposition method which enables a silicon nitride film to be deposited on the surface of a semiconductor substrate at such a low temperature at which the characteristics of the product semiconductor device will not be varied.

Another object of the present invention is to provide a silicon nitride film deposition method by which a dense and highly pure silicon nitride film can be deposited at a deposition rate acceptable from the industrial standpoint.

The method of this invention has been developed based upon the principle of chemical reaction that the reaction between silane and hydrazine gives silicon nitride.

Hydrazine ($NH_2 \cdot NH_2$) is decomposed at about 350° C. which is far lower than the decomposition temperature of ammonia, that is about 700° C. An intermediate product is formed in the process of decomposition, which is ultimately decomposed into nitrogen and hydrogen. Hydrazine has a melting point of 1.4° C. and a boiling point of 113.5° C., and therefore is a stable liquid at room temperature.

The present inventors have found that a transparent amorphous silicon nitrode film, having a satisfactory composition, purity, structure and density, could be deposited on the surface of a semiconductor substrate at an industrially acceptable deposition rate of 0.1 to 1 $\mu$ in thickness per a period of 30 to 60 minutes, by heating said surface at a temperature of 550° to 850° C. and acting on said heated surface a mixed gas composed of monosilane ($SiH_4$) (hereinafter referred to as silane for simplicity), hydrazine ($NH_2 \cdot NH_2$) and hydrogen and having been prepared by diluting the vapors of silane and hydrazine with hydrogen, the concentration of silane in said mixed gas being within the range from 0.01 to 1% by volume and that of hydrazine being within the range from 0.02 to 20% by volume.

BRIEF DESCRIPTION OF THE DRAWINGS

The method of this invention will now be described in detail with reference to the accompanying drawing which shows diagrammatically the apparatus to be used for the deposition of a silicone nitride film according to the present invention.

DESCRIPTION OF THE PREFERRED EMBODIMENT

Referring to the drawings, hydrogen having been purified in a purifier 1 is divided into two streams and sent into flow meters 2 and 3 respectively. The hydrogen entering the flow meter 3 is further led into a hydrazine saturator 4, maintained at a predetermined temperature, wherein it is saturated with hydrazine vapor. On the other hand, silane gas or silane gas diluted with hydrogen, is supplied through a flow meter 5 and is admixed with the aforesaid hydrogen from the flow meter 2 and the mixture of hydrogen and hydrazine from the hydrazine saturator 4, to form a reactant mixed gas composed of hydrogen, silane and hydrazine. In this case, the mixing ratio of the constituent gases is controlled by the respective flow meters 2, 3 and 5. The reactant gas thus formed is led into a silicon nitride deposition chamber 6 made of quartz and is decomposed on the surface of a semiconductor substrate, heated at a predetermined temperature, that is from 550° to 850° C., to form a silicon nitride film. The deposition rate of the silicon nitride is variable depending upon the temperature of the substrate as well as the concentrations of silane and hydrazine. In order to obtain an industrially acceptable deposition rate, i.e. the rate at which the silicon nitride film is formed in a thickness of 0.1 to 1$\mu$ per a period of 30 to 60 minutes, it is necessary to maintain the substrate within the temperature range from 550° to 850° C., the concentration of hydrazine within the range from 0.01 to 1% by volume, the concentration of silane within the range from 0.02 to 20% by volume, and the mol ratio of silane to hydrazine at a value not higher than 8. A substrate temperature below 550° C. will result in undesirably slow reaction of an intermediate product produced during the decomposition of silane and hydrazine, whereas a substrate temperature higher than 850° C. will result in exceedingly high decomposition rate of hydrazine, making it impossible to obtain a uniform silicon nitride film. On the other hand, concentrations of silane and hydrazine lower than 0.01% and 0.02% by volume respectively will result in undesirably low deposition rate of silicon nitride film, whereas concentrations of silane and hydrazine higher than 1% and 20% by volume will result in excessively high deposition rate, so that the thickness of the film being formed cannot be controlled. Now, when the mol ratio of silane to hydrazine exceeds 8, elemental silicon tends to be mixed in the resultant silicon nitride film. All of the conditions described above are objectionable for industrial operation of the method. The experiments have revealed that an amorphous silicon nitride can be produced most satisfactorily at an industrially acceptable rate, i.e. at the rate of 0.1 to 1$\mu$ in thickness per a period of about 30 to 60 minutes, by maintaining the substrate temperature from 600° to 750° C. and the concentrations of silane and hydrazine from 0.1 to 0.5% and 0.1 to 5% by volume respectively.

According to the method of the instant invention, a transparent amorphous silicon nitride film having a satisfactory composition, purity, structure and density can be deposited, not only on semiconductor substrates but also on any other solid substrate which is stable at temperatures higher than 550° C. In addition, the silane usable in the method of this invention is not restricted only to monosilane of the molecular formula $SiH_4$, but other silanes represented by the molecular formula $Si_nH_{2n+2}$ may also be used for the deposition of a satisfactory silicon nitride film as mentioned above. Still further, in the method of this invention, hydrazine and silane are not necessarily diluted with hydrogen but may be diluted with one or more inert gases selected from the group consisting of nitrogen, argon and helium.

In operating the method of this invention, the deposition chamber is heated per se and consequently the wall of said chamber is maintained at substantially the same temperature as the substrate temperature. Under such condition, a satisfactory deposition result can be obtained when the substrate temperature is within the range from 550° to 850° C. However, when means is provided which is adapted to cool the wall of the deposition chamber so as to prevent the formation of a silicon nitride film on said wall and to heat only the substrate and the surrounding area, silicon nitride film as good as that can be obtained at a substrate temperature in the range from 550° to 850° C. in respect of composition, purity, structure and density, can be obtained even when the substrate temperature is within the range of 850° to 1000° C. As described above, it is possible, according to the present invention, to deposit a satisfactory silicon nitride film on a substrate over a wde temperature range from as low as 550° C. to as high as 1000° C., and accordingly it is possible to select a temperature which is most suitable for the particular substrate material being processed.

Now, examples of the present invention will be illustrated hereunder.

Example 1

A thin silicon plate of 23 mm. in diameter and 0.2 mm. in thickness and having its surfaces polished, was laid on a graphite pedestal in a deposition chamber having an inner diameter of 48 mm. and a height of 500 mm., and was maintained at 700° C. by heating it externally using high frequency heating means. On the other hand, hydrogen was introduced into a hydrazine saturator at the rate of 100 cc. per minute, which hydrazine saturator was maintained at room temperature (about 20° C.). In the saturator, the hydrogen was saturated with hydrazine ($NH_2 \cdot NH_2$) and the resultant mixture was further mixed with a mixture of hydrogen, supplied at the rate of 20 cc. per minute, and monosilane ($SiH_4$), supplied at the rate of 80 cc. per minute, to form a mixed gas consisting of 0.4% of monosilane, 0.5% of hydrazine and the remainder of hydrogen. The mixed gas thus formed was acted on the aforesaid thin silicon plate for 10 minutes, whereby a 0.25 micron thick transparent silicon nitride film was formed on the surface of said silicon plate. The silicon nitride film was flat and smooth, with no pin hole present thereon, and had a sufficiently satisfactory composition, purity, structure and density.

The process described above was repeated using, instead of the silicon plate, thin plates of gallium arsenide, gallium phosphide, aluminum oxide, magnesium oxide, quartz glass, nickel and bolybdenum individually as a substrate, and silicon nitride film was deposited on the surfaces of the respective plates.

Example 2

A mixed gas consisting of 0.4% of monosilane ($SiH_4$), 0.5% of hydrazine ($NH_2 \cdot NH_2$) and the remainder of hydrogen was prepared in the same manner as in Example 1 and was led into a deposition chamber, wherein it was acted on the surface of a germanium substrate for 10 minutes, which was heated at 580° C. by high frequqency heating means. A transparent amorphous silicon nitride film of about 0.15 micron in thickness was deposited. The properties of the film thus formed were substantially the same as those of the silicon nitride film obtained in Example 1.

The process described above was repeated using, instead of the germanium substrate, thin plates of silicon, gallium arsenide, gallium phosphide, aluminum oxide, magnesium oxide, quartz glass, nickel and molybdenum individually as a substrate, and a silicon nitride film was deposited on the surfaces of the respective substrates.

The method of this invention, which enables a silicon nitride film to be deposited on the surface of a substrate at a temperature of as low as 550° C. as described hereinabove, has the advantages that the material of the substrate can be selected from an extremely wide range, that the method can be operated at a temperature most suitable for the particular substrate used, that the purification operation is rendered easy, that the handling of the materials is highly easy because the hydrazine is liquid at room temperature, and consequently that a highly excellent silicon nitride film can be deposited with ease. Thus, the present invention is of great industrial value.

According to the present invention, a double layer film composed of a silicon nitride film formed and a silicon dioxide film, which is useful for a diffusing mask, and for protecting and insulating film in the process of semiconductor device fabrication, can be made. In this case, the silicon dioxide base is first made according to any of the conventional methods.

What is claimed is:

1. In a method for depositing a silicon nitride ($Si_3N_4$) film by decomposing a mixed reaction gas consisting of silane ($SiH_4$), hydrazine ($N_2H_4$) and a carrier gas on a heated substrate, the improvement comprising employing a concentration of silane of 0.01–1% by volume of the mixed reaction gas, a concentration of hydrazine of 0.02–20% by volume of the mixed reaction gas and a volumeric ratio of silane to hydrazine of not more than 8.

2. A method according to claim 1, wherein the temperature of the heated substrate is 550–850° C.

3. A method according to claim 1, wherein the carrier gas is selected from the group consisting of hydrogen, nitrogen and rare gas.

4. A method according to claim 1, wherein silicon nitride film is deposited on a preformed silicon dioxide film.

5. A method according to claim 1, wherein the temperature of the heated substrate is 600–750° C., the concentration of silane is 0.1 to 0.5% by volume and the concentration of hydrazine is 0.1 to 5% by volume.

6. A method according to claim 1, wherein the substrate is selected from the group consisting of germanium, silicon, gallium arsenide, gallium phosphide, aluminum oxide, magnesium oxide, quartz glass, nickel and molybdenum.

References Cited

UNITED STATES PATENTS

| | | | |
|---|---|---|---|
| 3,009,834 | 11/1961 | Hanlet. | |
| 3,017,251 | 1/1962 | Kelemen. | |
| 3,226,194 | 12/1965 | Kuntz | 117—106 X |

FOREIGN PATENTS

| | | |
|---|---|---|
| 1,006,803 | 10/1965 | Great Britain. |
| 1,136,315 | 4/1963 | Germany. |
| 1,190,308 | 10/1959 | France. |

OTHER REFERENCES

F. Ephraim, Inorganic Chemistry 4th ed. Ed. by P.C.L. Thorne and E. R. Roberts, Interscience, N.Y. 1943, p. 656.

H. F. Sterling and R.C.G. Swann, The Radio Frequency Initiated Vapor Deposition of Glassy Layers, in Physics and Chemistry of Glasses, vol. 6, No. 3, June 1965, pp. 109 and 110.

Electronics, vol. 39, Jan. 10, 1966, p. 164.

ALFRED L. LEAVITT, Primary Examiner

C. K. WEIFFENBACH, Assistant Examiner

U.S. Cl. X.R.

117—106, 201